(12) United States Patent
Okojie

(10) Patent No.: US 9,975,765 B1
(45) Date of Patent: May 22, 2018

(54) FABRICATING ULTRA-THIN SILICON CARBIDE DIAPHRAGMS

(71) Applicant: The United States of Americas as represented by the Administrator of NASA, Washington, DC (US)

(72) Inventor: Robert S. Okojie, Strongsville, OH (US)

(73) Assignee: The United States of America as Represented by the Administrator of National Aeronautics and Space Administration, Washington, DC (US)

( * ) Notice: Subject to any disclaimer, the term of this patent is extended or adjusted under 35 U.S.C. 154(b) by 0 days. days.

(21) Appl. No.: 15/381,736

(22) Filed: Dec. 16, 2016

Related U.S. Application Data

(60) Provisional application No. 62/269,187, filed on Dec. 18, 2015.

(51) Int. Cl.
*B81C 1/00* (2006.01)
*G01L 9/00* (2006.01)

(52) U.S. Cl.
CPC ........ *B81C 1/00595* (2013.01); *G01L 9/0042* (2013.01); *B81C 2201/0132* (2013.01)

(58) Field of Classification Search
None
See application file for complete search history.

(56) References Cited

U.S. PATENT DOCUMENTS

| | | |
|---|---|---|
| 4,320,664 A | 3/1982 | Rehn et al. |
| 5,165,283 A | 11/1992 | Kurtz et al. |
| 5,549,006 A | 8/1996 | Kurtz |
| 6,058,782 A | 5/2000 | Kurtz et al. |
| 6,210,989 B1 | 4/2001 | Kurtz et al. |
| 6,706,549 B1* | 3/2004 | Okojie ................ B81C 1/00182 257/417 |
| 6,782,755 B2 | 8/2004 | Tai et al. |
| 6,912,759 B2 | 7/2005 | Izadnegahdar et al. |
| 7,152,478 B2 | 12/2006 | Peterson et al. |
| 7,404,247 B2 | 7/2008 | Eriksen et al. |
| 7,538,401 B2 | 5/2009 | Eriksen et al. |
| 7,723,232 B2 | 5/2010 | Legat et al. |
| 7,819,015 B2 | 10/2010 | Kurtz |
| 9,452,926 B1* | 9/2016 | Okojie ................ B81C 1/00555 |
| 2002/0197761 A1* | 12/2002 | Patel .................... B81C 1/00476 438/52 |
| 2016/0341552 A1* | 11/2016 | Kub .................... G01C 19/5684 |

* cited by examiner

*Primary Examiner* — Asok K Sarkar
(74) *Attorney, Agent, or Firm* — Robert H. Earp, III

(57) ABSTRACT

A process for fabricating relatively thin SiC diaphragms may include fast Reactive Ion Etching (RIE) followed by Dopant Selective Reactive Ion Etching (DSRIE). The process may produce silicon carbide (SiC) diaphragms thinner than 10 microns. These thinner, more sensitive diaphragms may then be used to effectively resolve sub-psi pressures in jet engines, for example.

20 Claims, 22 Drawing Sheets

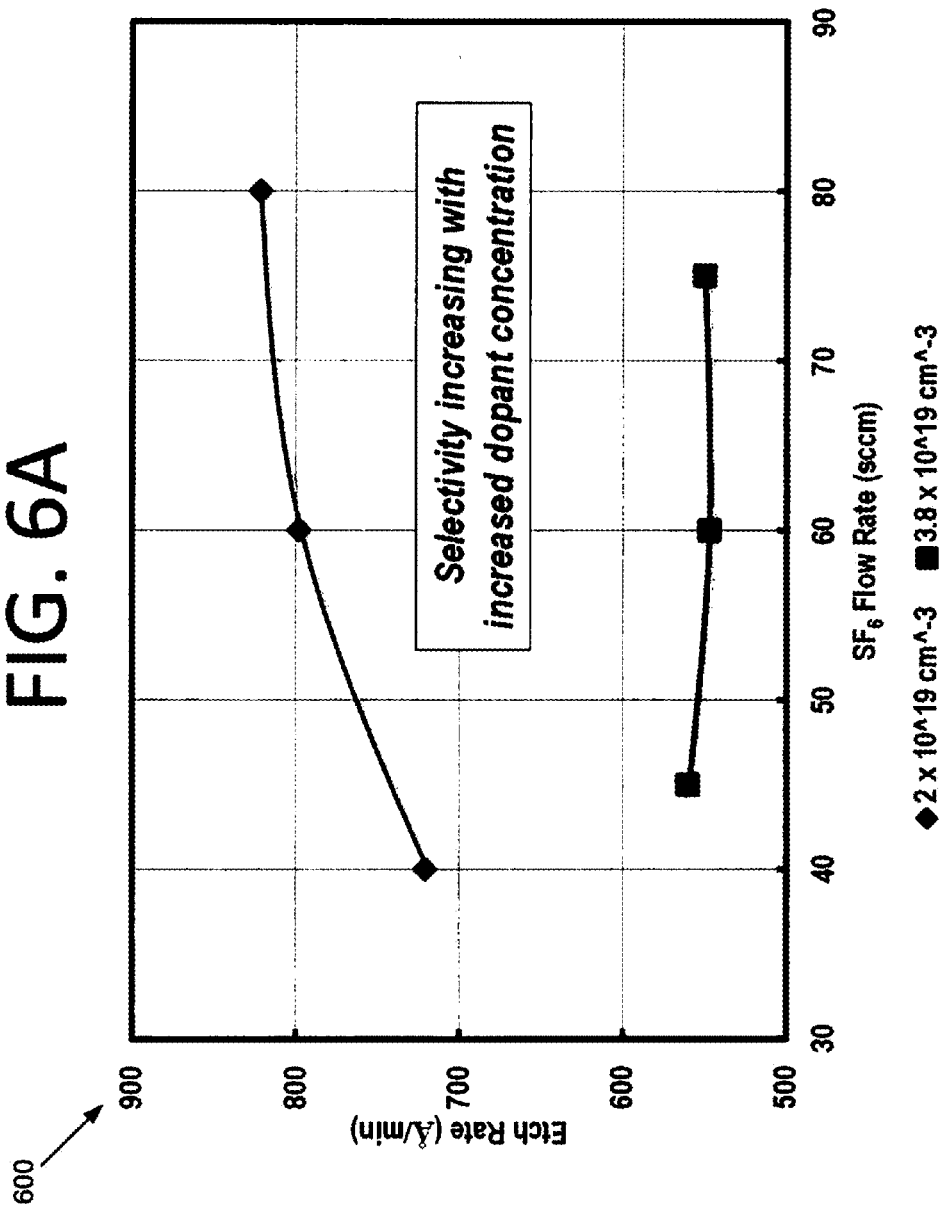

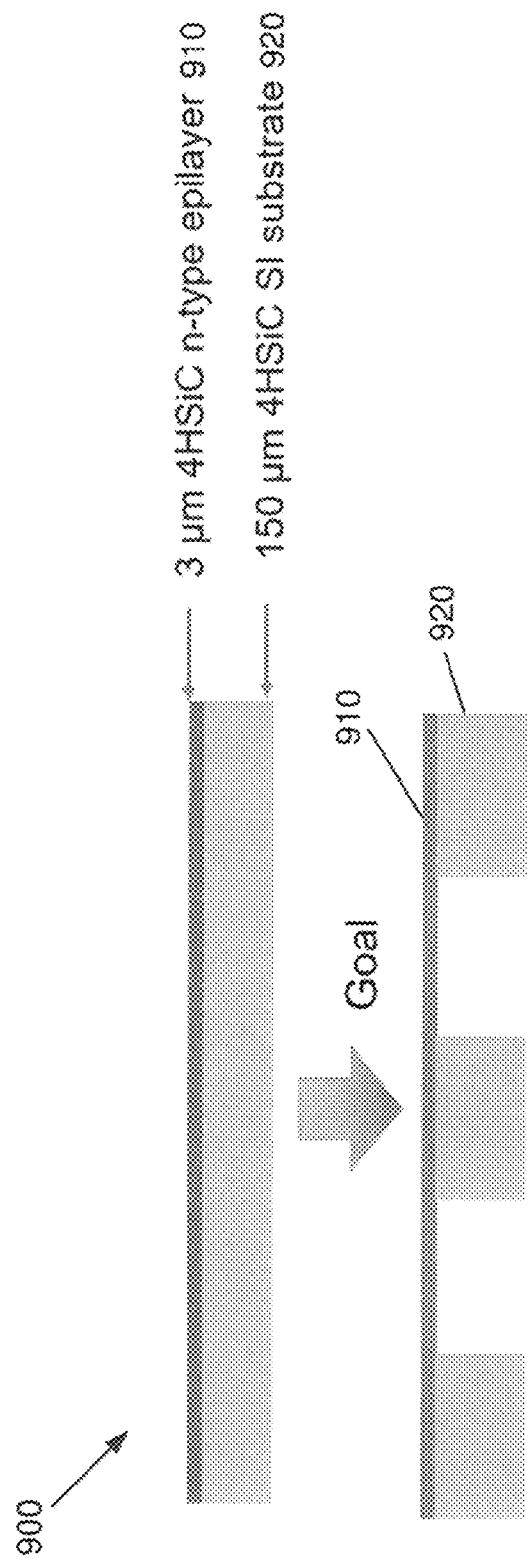

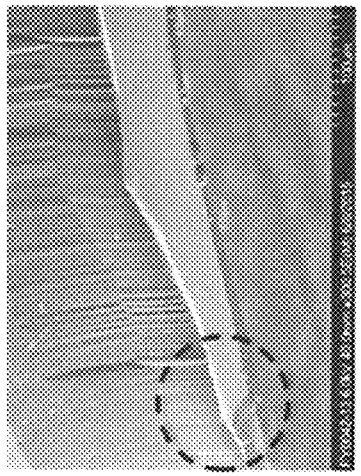
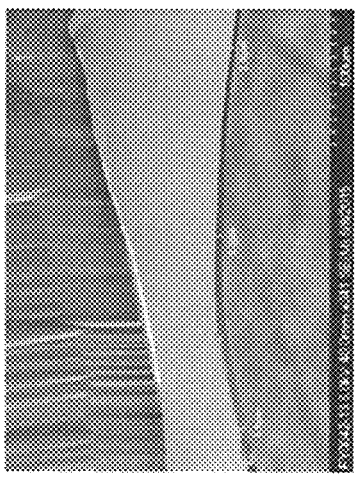
FIG. 10C

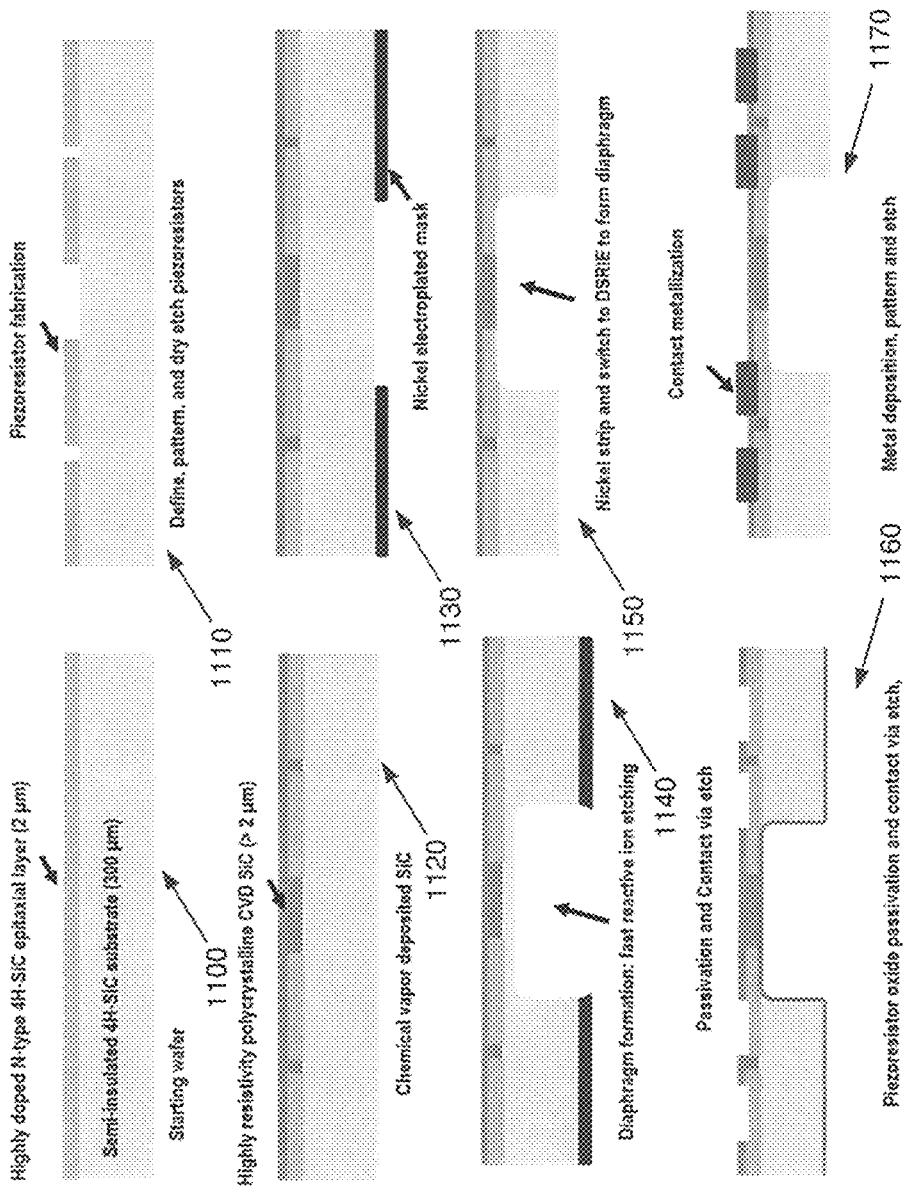

FABRICATING ULTRA-THIN SILICON CARBIDE DIAPHRAGMS

CROSS REFERENCE TO RELATED APPLICATION

This application claims the benefit of U.S. Provisional Patent Application Ser. No. 62/269,187 filed Dec. 18, 2015. The subject matter of this earlier-filed application is hereby incorporated by reference in its entirety.

ORIGIN OF THE INVENTION

The invention described herein was made by employees of the United States Government and may be manufactured and used by or for the Government for Government purposes without the payment of any royalties thereon or therefore.

FIELD

The present invention generally pertains to fabricating components, and more specifically, to fabricating ultra-thin silicon carbide (SiC) diaphragms.

BACKGROUND

Thermoacoustic instabilities in combustors are known to be precursor to flame-out or damage to engine components. Accurate quantification of combustor pressure dynamics for the primary purpose of experimental validation of computational fluid dynamics (CFD) codes requires the use of robust, reliable and sensitive pressure sensors that can resolve sub-psi pressure levels in high temperature environments (e.g., a combustor of a Brayton cycle heat engine). Current pressure sensors are placed feet away from a test article while pressure is transmitted through a tube. Since the tube is an acoustic filter, it imposes limitations on the frequency bandwidth of the thermoacoustics. Water-cooled pressure sensors are used in order to reduce the length of the tube and increase the bandwidth. However, the flow of the coolant around the sensor introduces turbulence noise, which tends to corrupt the signal.

Current uncooled microfabricated piezoresistive SiC pressure sensors produced by NASA Glenn Research Center are capable of operating reliably at 600° C. without these water cooling jackets. However, when used to quantify combustor thermoacoustic instabilities, while the SiC pressure sensors survived the high temperature and measured instabilities, these diaphragms (i.e., force collectors) are not thin enough to be sensitive in resolving sub-psi pressures. Existing instability prediction models have high uncertainty margins at high temperature.

30 microns is the thinnest diaphragm achievable with conventional reactive ion etching (RIE) processes. This diaphragm thickness precludes its use for sub-psi pressure measurement with high fidelity. Accordingly, an improved process for fabricating SiC diaphragms may be beneficial.

SUMMARY

Certain embodiments of the present invention may be implemented and provide solutions to the problems and needs in the art that have not yet been fully solved by conventional diaphragm fabrication technologies. For example, some embodiments of the present invention pertain to a process for fabricating SiC diaphragms that may produce diaphragms thinner than 10 microns. These thinner, more sensitive diaphragms may then be used to effectively resolve sub-psi pressures.

In one embodiment, a process includes performing Reactive Ion Etching (RIE) on exposed sections of a semi-insulating (SI) substrate of a wafer at a higher etch rate than achieved via Dopant Selective Reactive Ion Etching (DSRIE). The process also includes performing DSRIE to etch a remainder of the SI substrate, producing one or more diaphragms with a thickness of less than ten microns.

In another embodiment, a process for producing ultra-thin SiC diaphragms includes providing a wafer including a highly doped n-type 4H—SiC epitaxial layer and a SI 4H—SiC substrate layer. The process also includes fabricating piezoresistors on the epitaxial layer and performing a Chemical Vapor Deposition (CVD) process to grow a high resistivity polycrystalline CVD SiC on the piezoresistors. The process further includes electroplating a nickel mask onto a bottom of the SI 4H—SiC layer, but leaving exposed sections that are not covered with nickel. Additionally, the process includes forming diaphragms by performing RIE on the exposed sections of the SI 4H—SiC substrate, followed by performing DSRIE at a lower etch rate than the RIE.

In yet another embodiment, a process for forming SiC diaphragms includes performing RIE on exposed sections of a SI substrate of a wafer at a higher etch rate than achieved via DSRIE. The process also includes performing DSRIE to etch a remainder of the SI substrate, producing one or more diaphragms. The one or more diaphragms produced by the process have a thickness of between 4 and 7 microns and lack microtrenching.

BRIEF DESCRIPTION OF THE DRAWINGS

In order that the advantages of certain embodiments of the invention will be readily understood, a more particular description of the invention briefly described above will be rendered by reference to specific embodiments that are illustrated in the appended drawings. While it should be understood that these drawings depict only typical embodiments of the invention and are not therefore to be considered to be limiting of its scope, the invention will be described and explained with additional specificity and detail through the use of the accompanying drawings, in which:

FIG. 6A is a graph illustrating etch selectivity in two n-type SiC samples having different nitrogen dopant concentrations, according to an embodiment of the present invention.

FIG. 9 illustrates etching of a component in the etching process, according to an embodiment of the present invention.

FIGS. 10B and 10C illustrate magnified images that show microtrenching and diaphragm thicknesses, according to an embodiment of the present invention.

FIG. 11 illustrates a process for producing ultra-thin SiC diaphragms, according to an embodiment of the present invention.

DETAILED DESCRIPTION OF THE EMBODIMENTS

Some embodiments of the present invention pertain to a process for fabricating relatively thin SiC diaphragms. The process of some embodiments may produce diaphragms thinner than 10 microns. These thinner, more sensitive diaphragms may then be used to effectively resolve sub-psi pressures.

A technology gap exists in the capability to directly and accurately measure sub-psi dynamic pressures in combustors for the purpose of improving experimental validation of CFD codes at high temperature, and also to monitor the onset of thermoacoustic instabilities. The state of the art pressure sensors not produced by NASA Glenn Research Center can operate reliably up to about 350° C., albeit with water cooling jackets to ensure measurement reliability and provide cooling. Even with cooling jackets, these SoA sensors are still placed several inches to feet away from the combustion chamber via an infinite loop tube. Such a measurement strategy causes the attenuation of key frequency components and a delay in pressure propagation through the tube, affecting fidelity and the chance for real time active control of combustion instabilities. In addition, there is the tendency for the localized turbulence generated by the cooling water within the cooling jacket to be incorrectly read by the sensors as true value, thereby providing false readings.

Robust and reliable sensors needed for direct (i.e., no water cooling) measurement of sub-psi dynamics at more than 500° C. are not currently available from vendors. Commercially available dynamic pressure sensor that is claimed to operate up to 780° C. is the Meggitt™ CP-215 piezoelectric pressure sensor made from $GaPO_4$ piezoelectric crystal. This material does not exist naturally, and hence, is synthesized.

NASA Glenn Research Center has developed 600° C. SiC pressure sensor technology. However, current SiC fabrication technology cannot produce the ultra-thin diaphragms (less than 10 μm) needed to achieve the high sensitivity to resolve sub-psi pressure dynamics. To address this problem, some embodiments, employ a Dopant Selective Reactive Ion Etching (DSRIE) technique that results in ultra-thin (e.g., less than 5 microns) SiC diaphragms to accurately resolve sub-psi dynamics at temperatures in excess of 500° C. The fabrication process for the realization of ultra-thin diaphragms is a three-step reactive ion etching process in some embodiments. This three-step process may include: (1) reactive ion etching the exposed sections of the semi-insulating substrate at a high etch rate; (2) removal of the etch mask; and (3) using a DSRIE recipe to etch the remainder of the semi-insulated material in the diaphragm.

Figure 1:
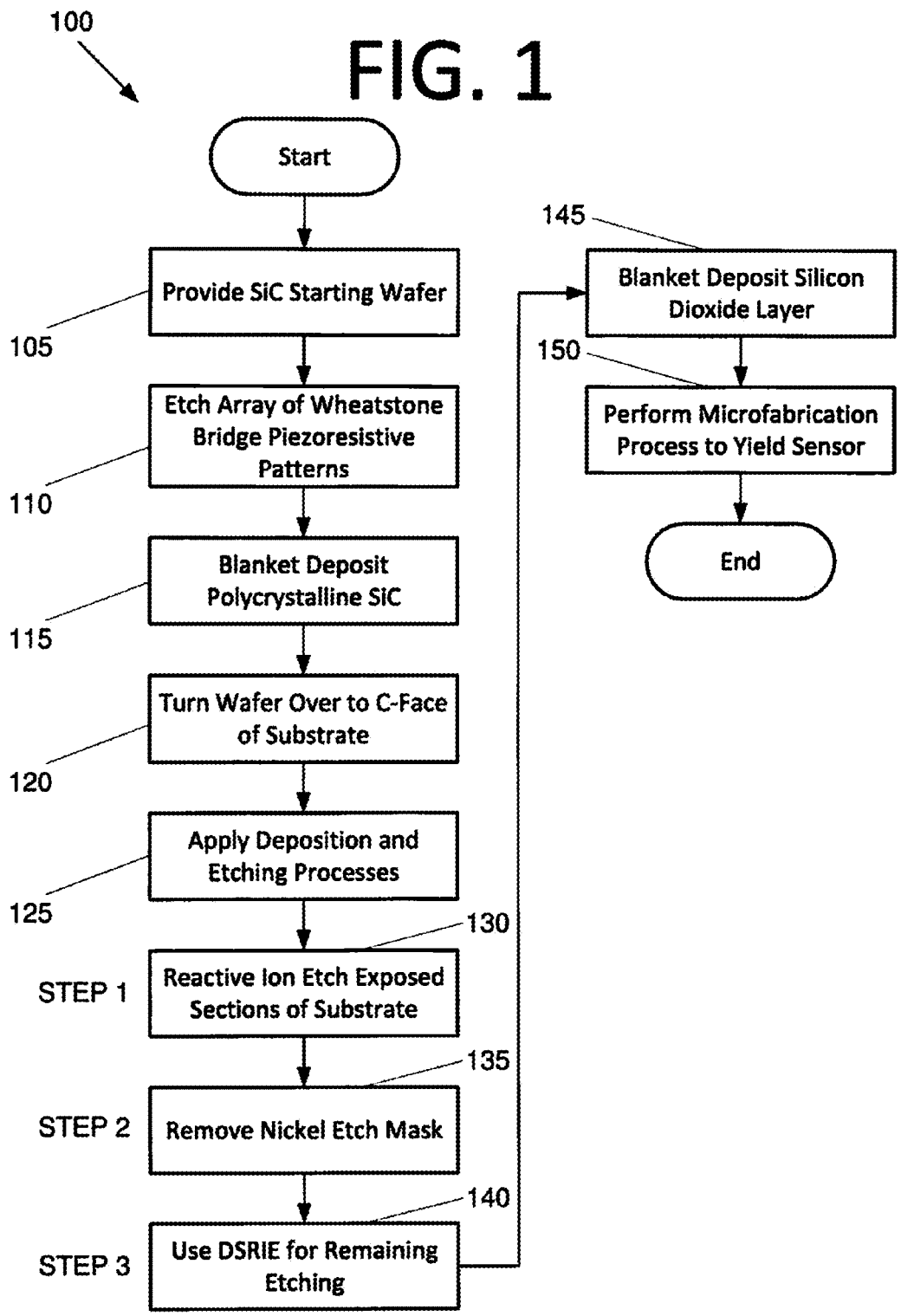
FIG. 1 is a flowchart illustrating a reactive ion etching process for fabricating ultra-thin SiC diaphragms, according to an embodiment of the present invention.

Such a reactive ion etching process for fabricating ultra-thin SiC diaphragms that includes the above-mentioned three-step process is illustrated in flowchart 100 of FIG. 1. The process beings with providing a SiC starting wafer at 105. The wafer may be cleaned for 10 minutes in acetone and ten minutes in isopropyl alcohol (IPA) prior to use. The starting wafer in some embodiments is a semi-insulated, off-axis, single crystal 4H—SiC wafer that is about 250 microns thick. On the silicon face of the wafer is a homoepitaxially grown n-type 4H—SiC of between 2 and 4 microns in thickness in some embodiments. The doping level of the n-type epitaxial layer may be greater than $1\times10^{19}$ (1E19) per cubic centimeter. An array of Wheatstone bridge piezoresistive patterns may be etched into the epitaxial layer at 110 by conventional reactive ion etching, deep enough to have etched slightly into the underlying semi-insulated substrate. This forms an etched n-type piezoresistor array that is electrically isolated from the semi-insulated substrate.

Next, high resistivity polycrystalline SiC is blanket deposited at 115 over the etched n-type piezoresistor array such that the resistors are completely enveloped and sandwiched between the polycrystalline SiC and the semi-insulating single crystal SiC. The wafer is then turned over to the c-face of the semi-insulated substrate at 120 in preparation for the fabrication of the ultra-thin diaphragm. Conventional deposition and etching processes are applied at 125 to obtain a patterned nickel contact mask on the semi-insulated substrate. The nickel may be 230 nm thick and deposited in a Cooke E-beam Evaporator, for example. Optical lithography may be performed to pattern the nickel, and a wet etch may be performed to etch the nickel. For instance, nickel etchant may be applied for four minutes and acetone may be applied for ten minutes to remove photoresists.

The first step of the above-mentioned three-step reactive etching process is reactive ion etching the exposed sections of the semi-insulating substrate at a high etch rate at 130 using argon and sulfur hexafluoride to a depth of 100 microns. This is followed by the removal of the nickel etch mask as the second step at 135. The nickel may be removed by applying nickel etchant for four minutes, for example. Etching of the c-face of the semi-insulated substrate continues, using the same above gases at the same etch rate for another 100 microns depth.

At this stage, the semi-insulating material left in the diaphragm is 50 microns. The third etch step is using a DSRIE recipe, using only sulfur hexafluoride, or a mix of boron trichloride and chlorine, to etch the remaining 50 microns of the semi-insulated material in the diaphragm at 140. There is etch selectivity between the semi-insulated substrate and the n-type material. As a result, the etching will slow down after 50 microns of etching because the n-type epitaxial layer is now exposed. The thickness of the diaphragm is thus determined by the thickness of the polycrystalline silicon carbide. Next, a 1 micron thick silicon dioxide layer is blanket deposited over the diaphragm side of the wafer at 145 to provide compliant mechanical stability to the diaphragm. Subsequent processing of the wafer is by performing a standard microfabrication process at 150 to realize the pressure sensor.

Figure 2:
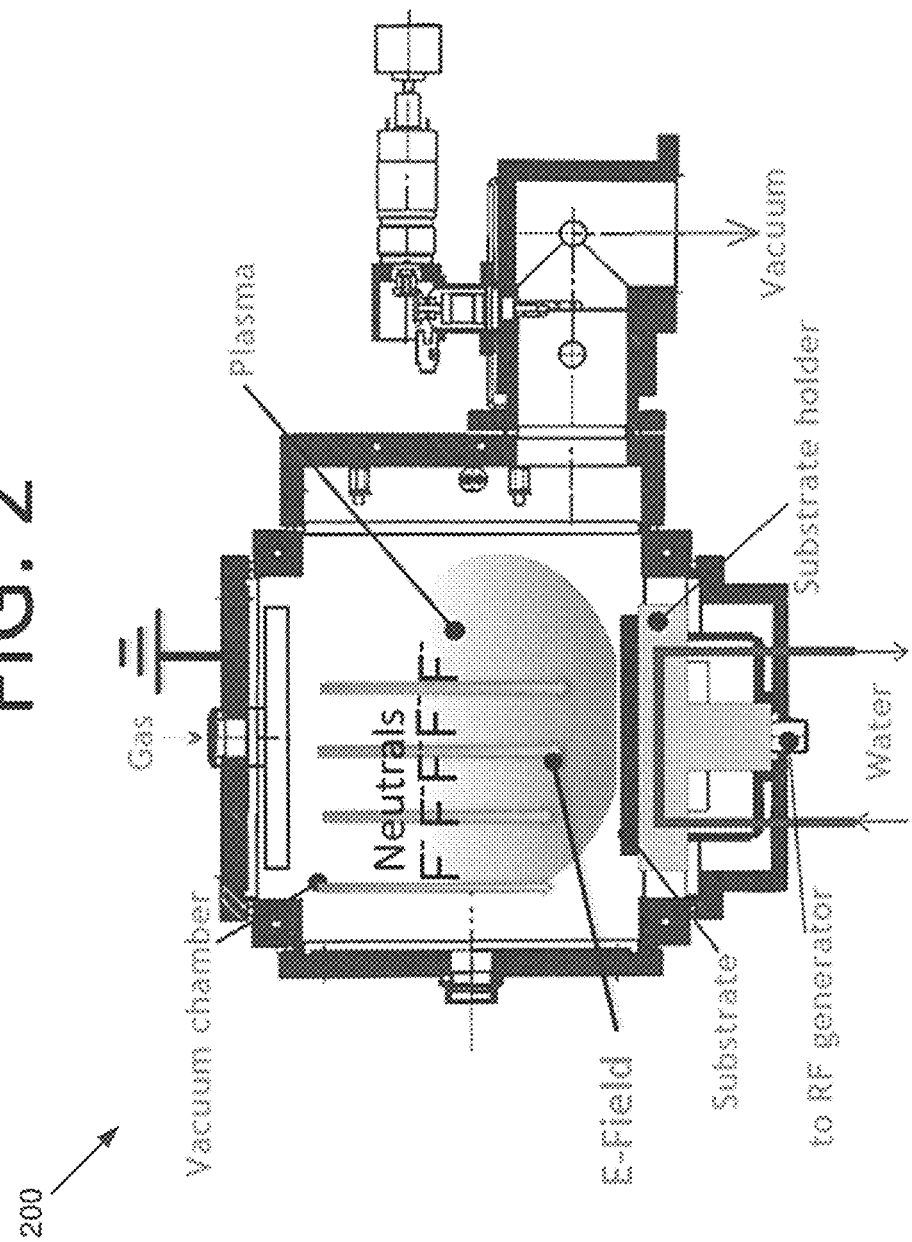
FIG. 2 is a side perspective view illustrating an RIE processing chamber.

DSRIE in SiC is a technique for the fabrication of ultra-thin (~2 μm) planar and 3-D structures for application in new and emerging sensor technologies. The micro diaphragms of SiC piezoresistive pressure sensors are conventionally fabricated by a reactive ion etching (RIE) process. A RIE processing chamber 200 is shown in FIG. 2. Halogen based gas (i.e., $SF_6$) is ionized to create $F^-$ ions and neutrals. Neutrals react chemically with the target, producing low etch rates. With argon added and ionized, $Ar^+$ physical bombardment of the target increases surface area, which leads to increased chemical reaction and higher etch rates.

Figure 3:
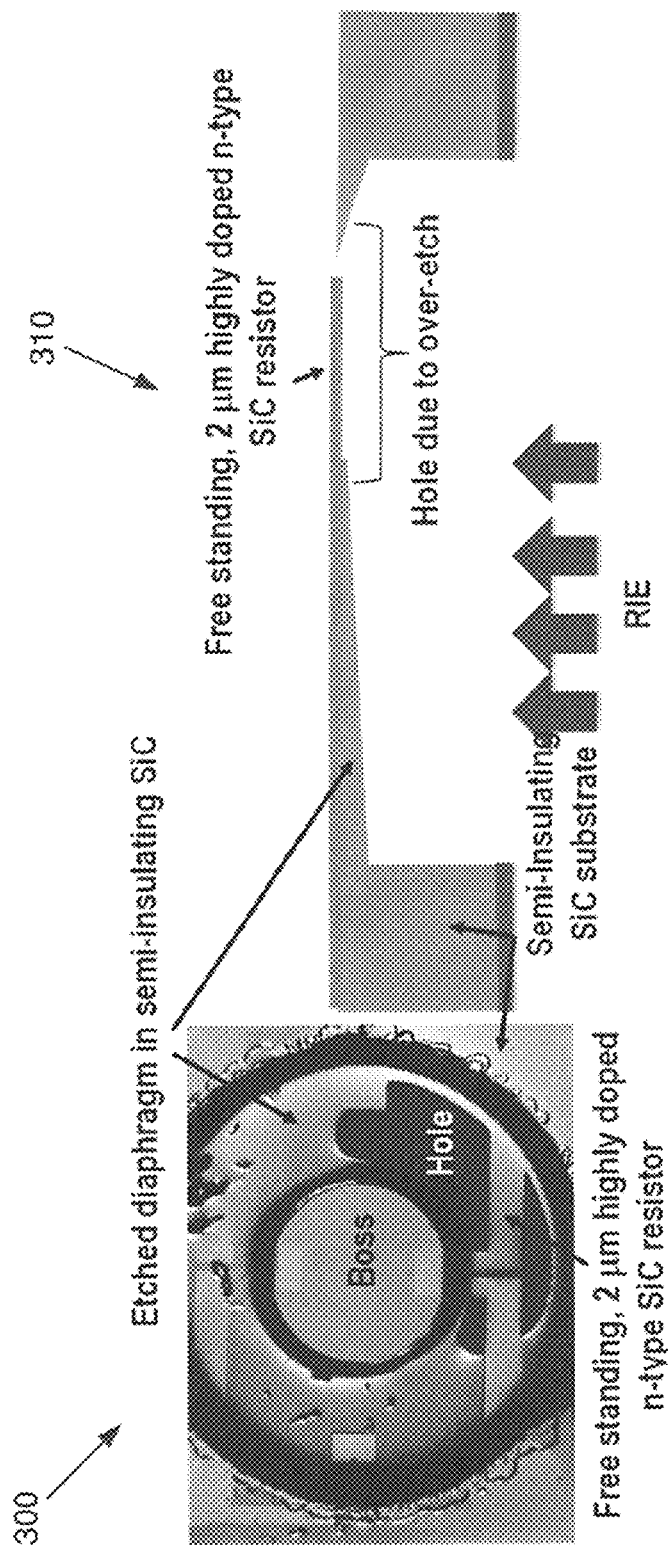
FIG. 3 illustrates an actual test image and a cross-section of an etched diaphragm in semi-insulating SiC, according to an embodiment of the present invention.

Diaphragms as thin as 30 microns can be successfully realized using this conventional process. In the attempt to apply the conventional reactive ion etching (RIE) process to create thin (10 μm) diaphragms from a thick semi-insulated (SI)-SiC wafer, an accidental over-etch punctured holes through sections of the diaphragms. See cross-section 310 of FIG. 3. Surprisingly, sections of the thin (2 μm) highly doped n-type SiC resistor residing directly on the over-etched SI-SiC remained intact. See image 300 and cross-section 310 of FIG. 3. This resulted in suspended n-type SiC resistor elements while the remaining sections were still attached on the surviving SI-SiC diaphragm. The phenomenon was hypothesized to be an example of DSRIE in SiC.

Figures 4A, 4B:
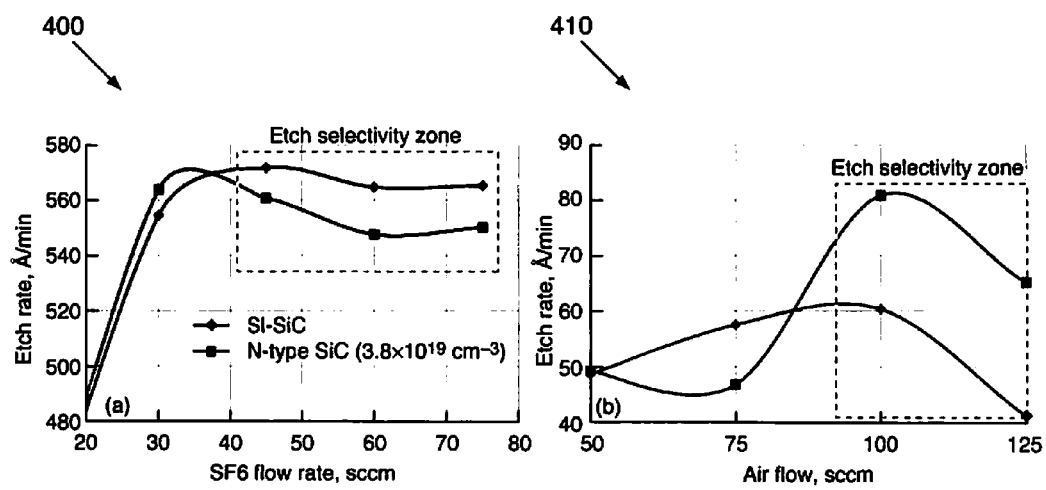
FIG. 4A is a graph illustrating etch-rate selectivity demonstrated between SI-SiC and a highly doped n-type substrate in $SF_6$ gas only with flow rates greater than 45 standard cubic centimeters per minute (sccm), according to an embodiment of the present invention.
FIG. 4B is a graph illustrating etch-rate selectivity demonstrated between SI-SiC and a highly doped n-type substrate in argon gas only with flow rates greater than 100 sccm, according to an embodiment of the present invention.
Figure 4C:
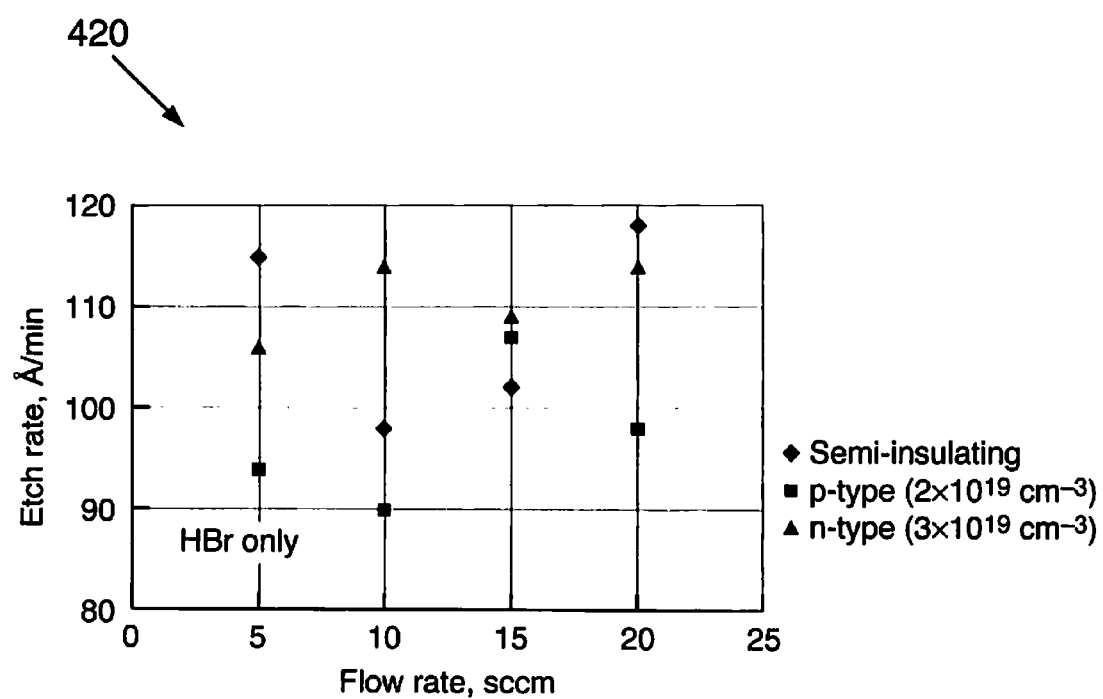
FIG. 4C is a graph illustrating etch rate versus flow rate for HBr only, according to an embodiment of the present invention.
Figure 4D:
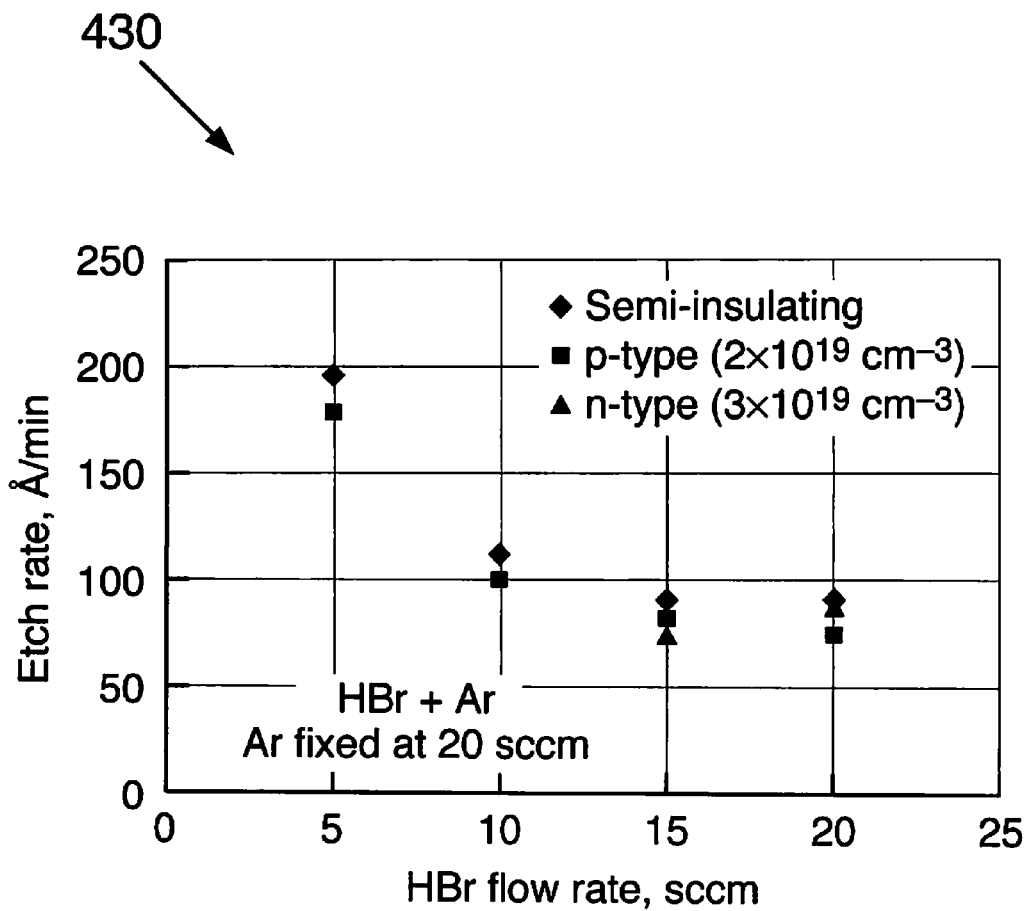
FIG. 4D is a graph illustrating etch rate versus flow rate for HBr+Ar, according to an embodiment of the present invention.
Figure 4E:
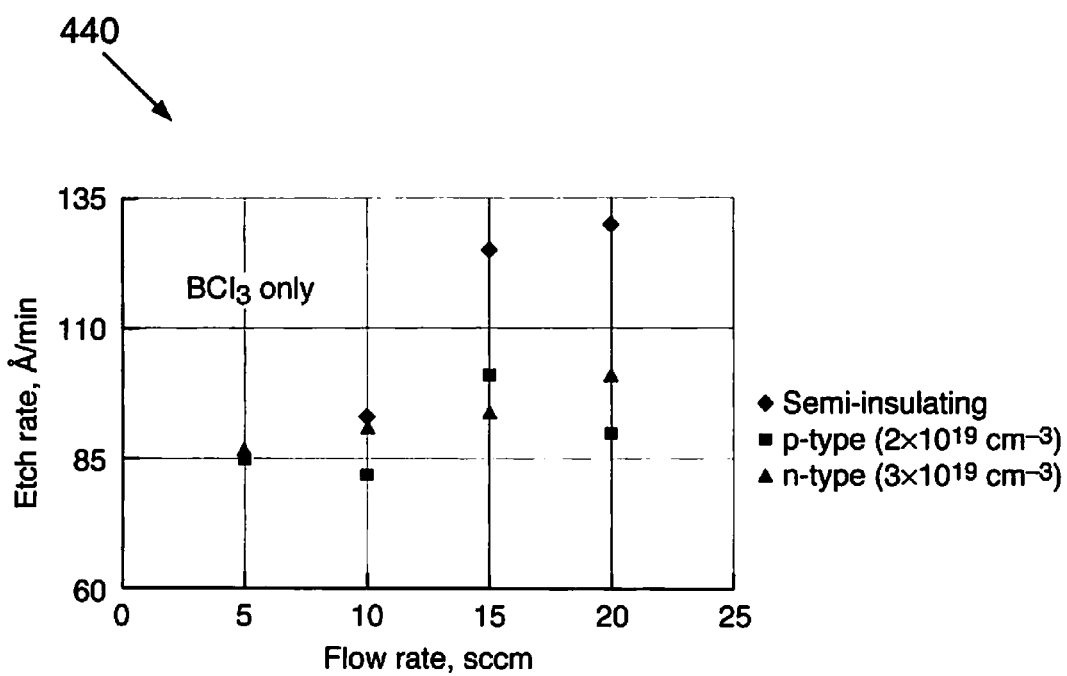
FIG. 4E is a graph illustrating etch rate versus flow rate for $BCl_3$ only, according to an embodiment of the present invention.
Figure 4F:
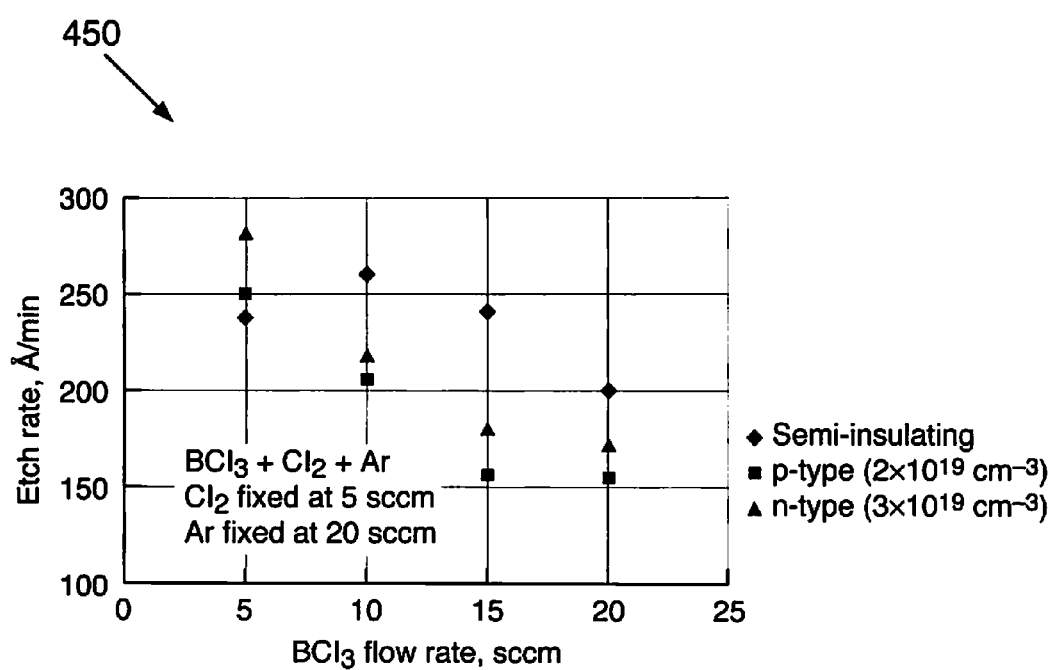
FIG. 4F is a graph illustrating etch rate versus flow rate for $BCl_3+Cl_2+Ar$, according to an embodiment of the present invention.
Figure 4G:
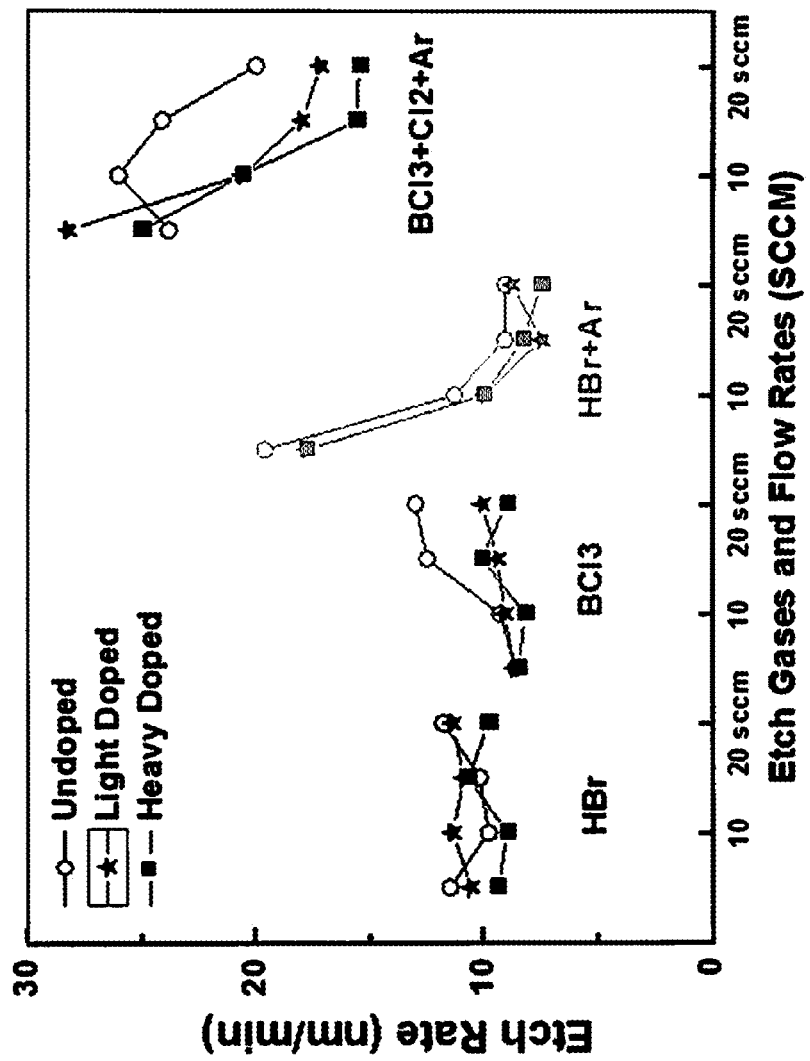
FIG. 4G illustrates graphs showing etch rate versus flow rate for the gases of FIGS. 4C-F together, according to an embodiment of the present invention.

Preliminary RIE results from experiments using a sulfur hexafluoride ($SF_6$) plasma showed the first evidence of etch-rate selectivity between SI and highly doped n-type SiC substrates, as seen in graph 400 of FIG. 4A, and separately also in argon plasma, as seen in graph 410 of FIG. 4B. Graphs 420-450 of FIGS. 4C-F show etch rate versus flow rate for HBr only, HBr+Ar, $BCl_3$ only, and $BCl_3$+$Cl_2$+Ar, respectively. FIG. 4G shows etch rate versus flow rate for the gases of FIGS. 4C-F together. A summary of etch rate selectivity between SI and n-type 4H—SiC is presented in Table 1 below.

TABLE 1

SUMMARY OF ETCH RATE SELECTIVITY

| Gases: | Power (W) | Flow Rate (sccm) | ER |
|---|---|---|---|
| $SF_6$ | 400 | 60 | 1.03 |
| HBr | 100 | 10-20 | ~1 |
| $BCL_3$ | 100 | 15-20 | 1.33 |
| $BCl_3$ + $Cl_2$ + Ar | 100 | $BCl_3$ (15), $Cl_2$ (5), Ar (20) | 1.37 |

These results provide the motivation to perform a full factorial design of experiments to reproduce the experiments and optimize the process for higher etch-rate selectivity.

The DSRIE proof of concept was demonstrated by applying it to release 200 μm long, 2 μm thick, and 20 μm wide n-type single-crystal SiC cantilevers from the semi insulating single-crystal substrate. This is shown in proof of concept 500 of FIG. 5. On the basis of this proof of concept of controlled application of dopant etch selectivity between n-type and semi insulating SiC, the process can now be extended to demonstrate its utilization in realizing sub-psi SiC pressure sensors, for example.

Figure 6B:
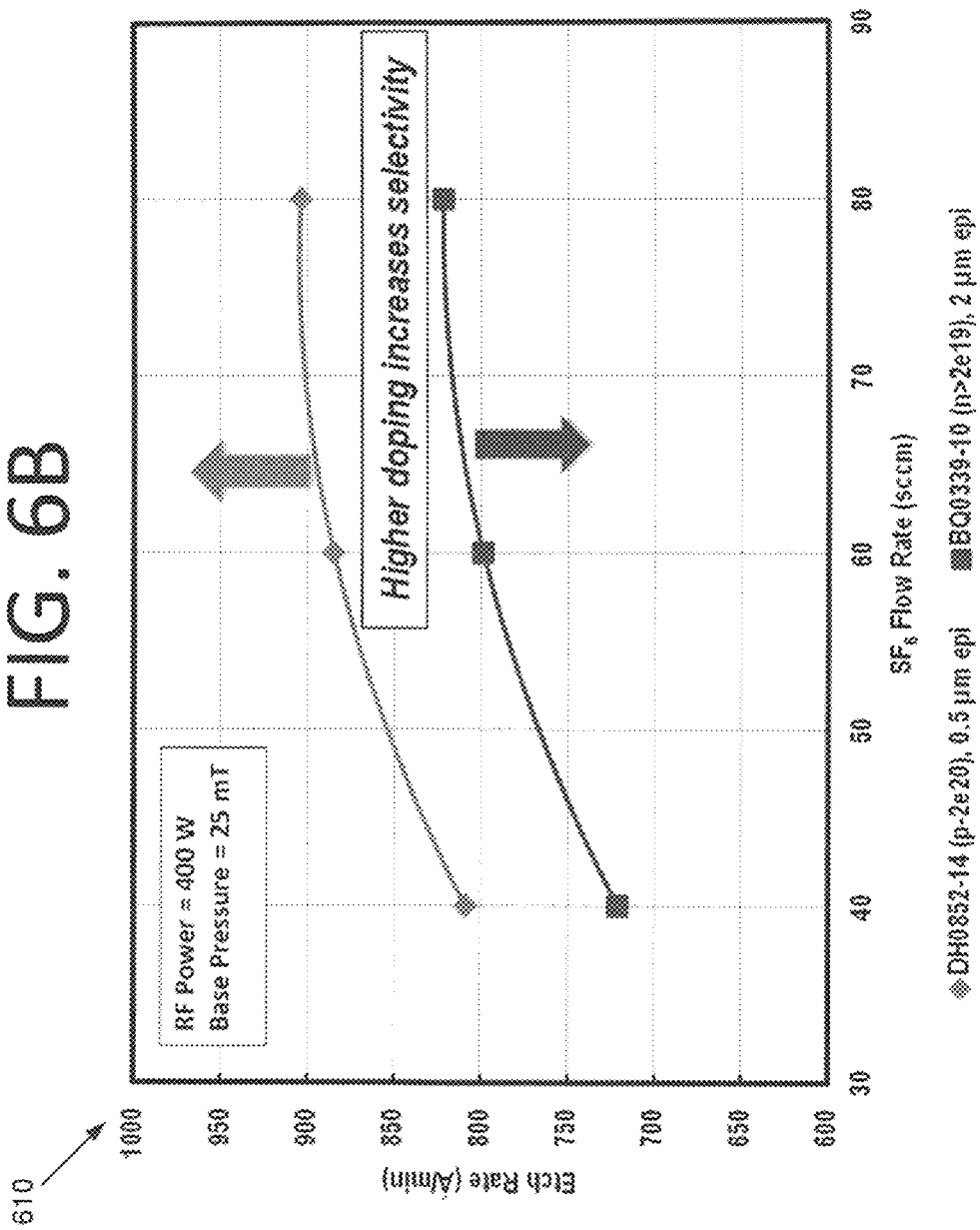
FIG. 6B is a graph illustrating etch selectivity between n-type and p-type 4H—SIC substrates in $SF_6$ gas only, according to an embodiment of the present invention.

The chemistry-physics of SiC-DSRIE were experimentally investigated in terms of the relationship between dopant concentration and reactivity in a fluorine-based ($SF_6$) plasma. From the preliminary results, it was observed that, for the two n-type conductivities investigated, the etch rate decreased with increasing dopant concentration, as shown in graph 600 of FIG. 6A. Evidence of etch selectivity was also observed between n-type and p-type SiC. In this case, highly doped p-type SiC was found to have higher etch rates than n-type conductivity of certain dopant concentration, as shown graph 610 in FIG. 6B. The results shown in FIGS. 4A and 4B indicate that n-type structures can be successfully released from either p-type or SI substrates.

Two major objectives may be accomplished in parallel. One objective is to leverage the knowledge discussed above to fabricate and test sub-psi resolution (<1 psi) SiC pressure sensors. At the same time, further improvement of the understanding of the DSRIE mechanisms may be undertaken through the investigation of various combinations of doping levels and conductivities, with the goal to optimize the etch selectivity.

RIE equipment may be used to perform DSRIE. See, for example, RIE processing chamber 200 of FIG. 2. SiC substrates of different doping levels and conductivities may be masked and simultaneously etched under fixed etching conditions per sample set. A focused ion beam may be used to cross section the samples, after which field emission scanning electron microscopy may be used to accurately measure the etched trenches to extract etch rates. The role and influences of $SF_6$, chlorine, and $BCl_3$ plasmas may be analyzed in terms of optimal etch-rate selectivity, as well as the effects of RIE power and bias voltage. Desorption and adsorption chemistries may be understood in terms of the optimum conditions needed to promote the highest dopant selectivity.

One area where some embodiments may be particularly beneficial is in research that may lead to lowering greenhouse gas emissions by 50%, relative to 2005 baseline, and improving fuel combustion efficiency by 2% per year to 2020 as part of the ICAO (International Civil Aviation Organization) goals. It has been demonstrated that lean combustion (i.e., lower fuel/air ratio) further reduces undesirable emissions and increases combustion efficiency. However, lean burning increases the potential for thermoacoustic instability, which is a precursor to flame-out and possible damage to critical engine components. This instability should be detected and mitigated in its infancy (i.e., at sub-psi levels) to ensure passenger safety. Existing combustor instability prediction models have high uncertainty margins at high temperature. There is, therefore, a critical need for very sensitive, highly reliable, and environmentally robust pressure sensors for model validation and improvement.

Figure 5:
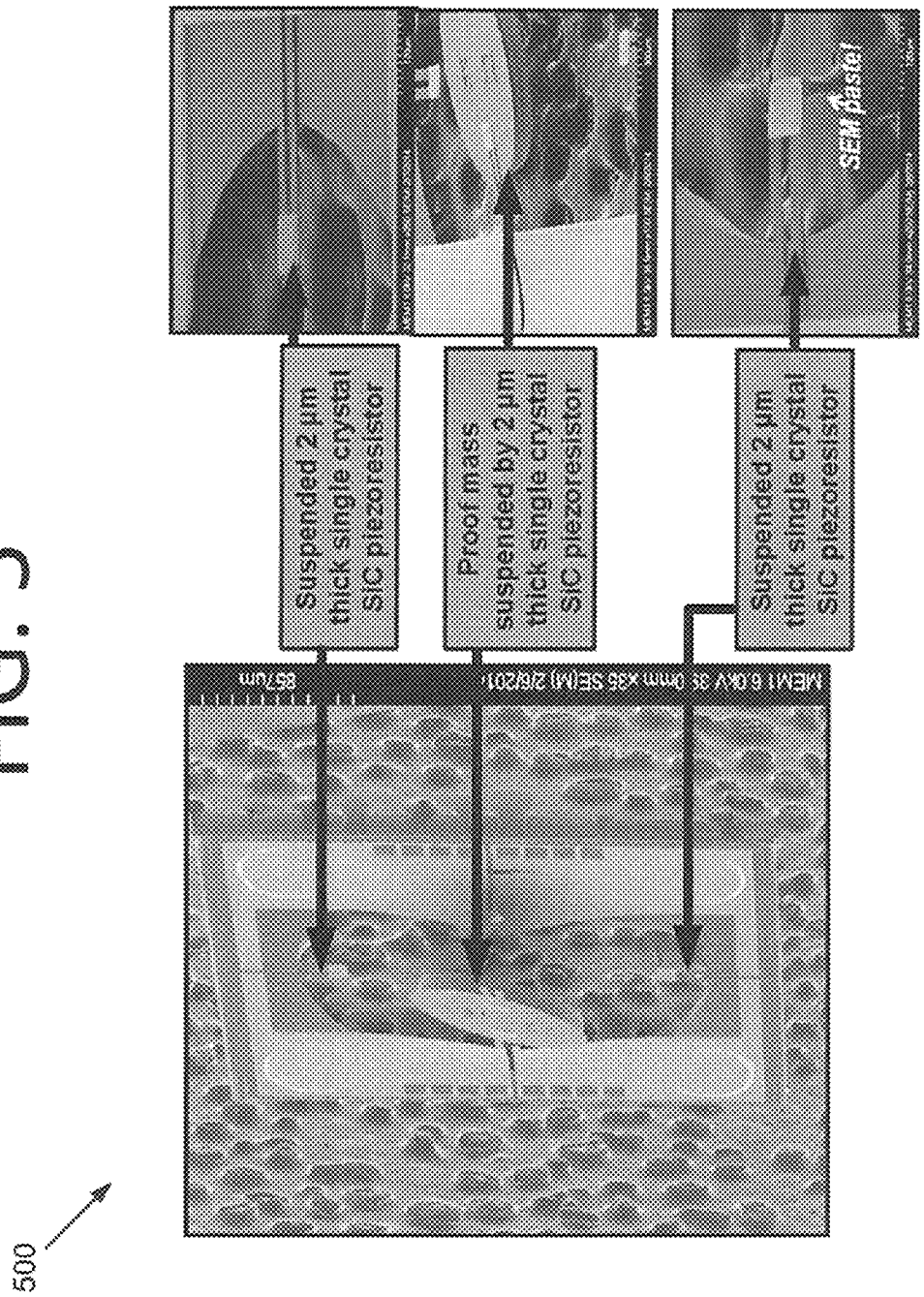
FIG. 5 illustrates a proof of concept of n-type single-crystal 4H—SiC piezoresistor cantilevers successfully released from the 4H—SiC semi-insulating substrate using the DSRIE process, according to an embodiment of the present invention.
Figure 7:
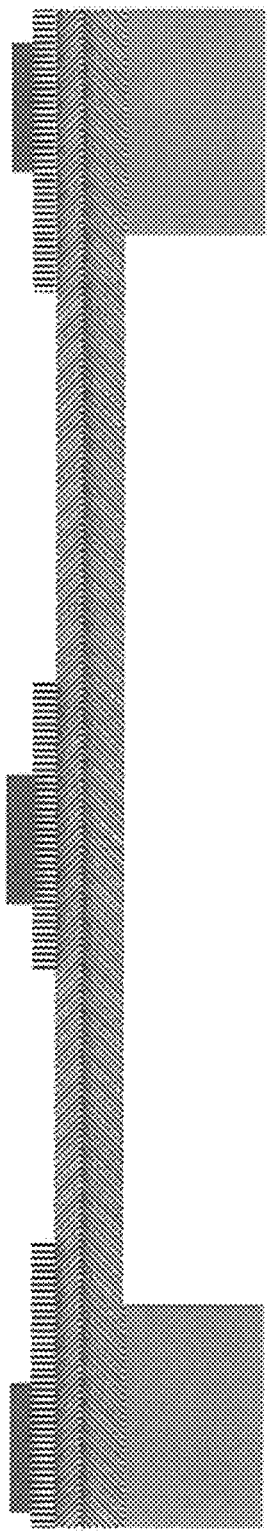
FIG. 7 is a cross section illustrating a proposed 5 μm thin SiC diaphragm based on DSRIE, according to an embodiment of the present invention.

A DSRIE fabrication proof of concept demonstrated the ability to fabricate freestanding n-type SiC cantilevers that are as thin as 2 μm (See FIG. 5). This fabrication technique can thus be extended to realize ultra-thin SiC diaphragms that are sensitive enough to accurately resolve sub-psi dynamics. By leveraging the DSRIE process with the advancement already made in extending pressure sensing to 600° C., it becomes feasible to realize very sensitive, highly reliable, and environmentally robust pressure sensors critically needed for model validation and improvement. Based on circular plate theory, maximum deflection (for deflections much smaller than thickness) of a clamped circular plate is expressed as:

$$w = \frac{3Pr^2}{16Eh^3}(1-v^2) \qquad (1)$$

where w is the maximum deflection in meters, P is the applied pressure in Pascals, r is the diaphragm radius in meters, E is Young's Modulus in Pascals, h is the diaphragm thickness in meters, and v is the Poisson ratio. Therefore, for E=475 GPa for SiC, h=5 μm, r=1 mm, v=0.212, the predicted applied pressure for a 1 μm diaphragm deflection is ~345 Pa (0.05 psi). The calculated maximum stresses on the diaphragm are 6.27 MPa at the center and −10 MPa at the clamped edge, which are both well below the fracture strength of SiC. A cross section illustration of a proposed SiC diaphragm 700 fabricated by DSRIE is shown in FIG. 7. The thickness of the diaphragm is determined by the thickness of the epitaxial layer grown on the SI substrate.

In addition to further exploring the $SF_6$ gas, $NF_3$ and $BCl_3$ gases may also be investigated and used. Comparison of the etch rate selectivity of the plasmas associated with these gases as they apply to the doping concentrations and conductivities may be investigated to selection thereof. Most of this task may be performed with RIE equipment in a microfabrication cleanroom. For this task, the anticipated outcome is to compare the etch rate selectivity and optimize the process that provides the highest applicable selectivity.

Figure 8:
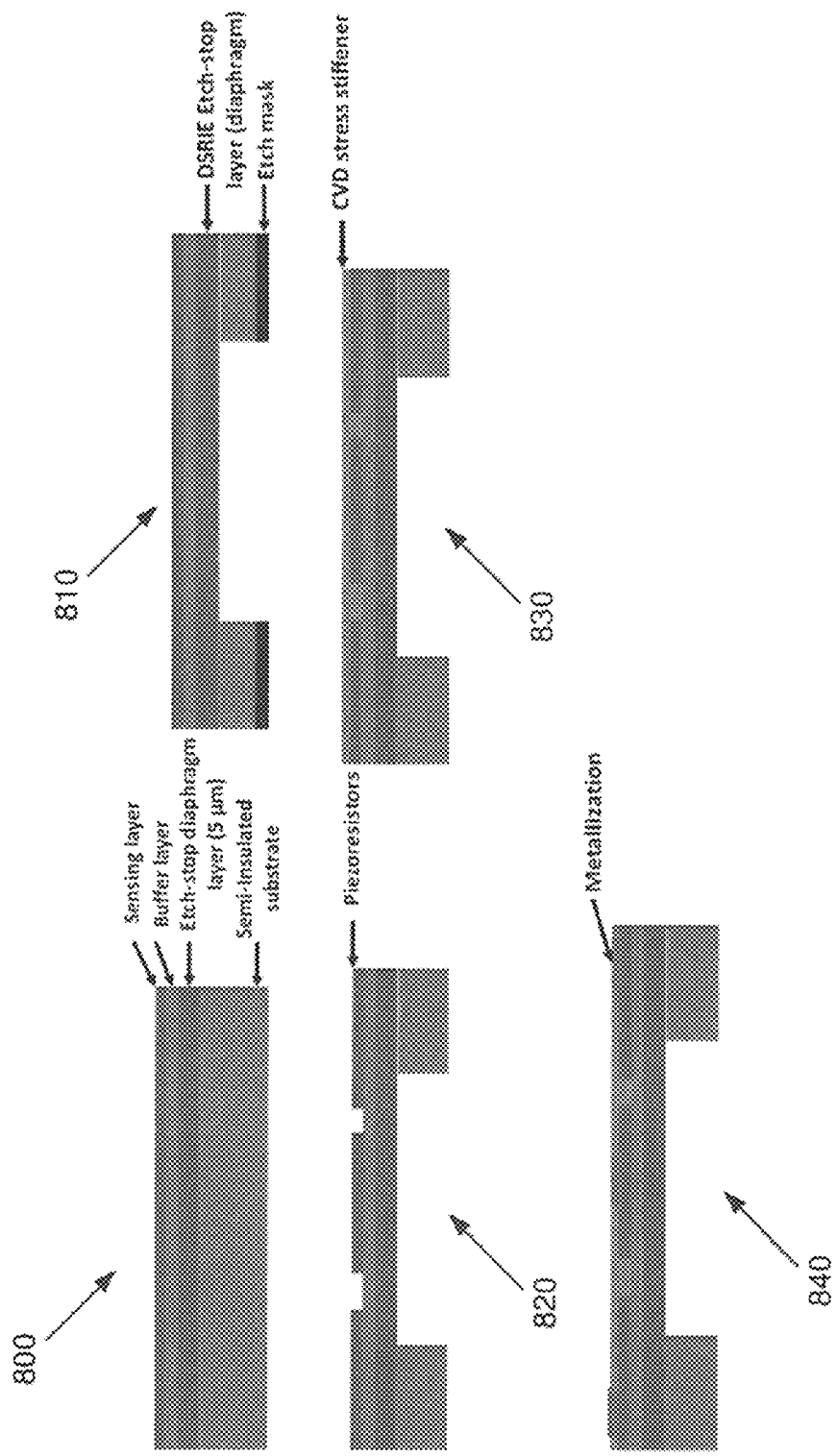
FIG. 8 illustrates fabrication steps for fabricating thin (less than 5 μm) SiC diaphragms using DSRIE, according to an embodiment of the present invention.

Since the DSRIE concept has been demonstrated above and used to release 2 μm thin cantilevers (see FIG. 3), the process may be used to realize actual sub-psi SiC pressure sensors. This would serve as further proof of the viability of the concept for implementing next generation ultra-sensitive pressure sensors in SiC. To that end, SiC wafers with the appropriate epitaxial layer configurations may be procured and used to batch fabricate the sensors, as described in condensed form in steps 800, 810, 820 in FIG. 8, respectively. After fabrication of the diaphragms, a Chemical Vapor Deposition (CVD) process may be used to grow a thin layer of polycrystalline SiC on the diaphragm, as shown in step 830. The function of this layer is to provide locked-in compressive stress to stiffen the diaphragm. Following further traditional batch fabrication processes that includes metallization (see step 840), selected good sensors diced from the wafers may be packaged, and the packaged sensors may be tested in a sensor testing laboratory.

This process may apply the knowledge herein to optimize and refine the process of fabricating a second generation of sub-psi pressure sensors. In addition, other basic functional structures for realizing devices, such as surface flow anemometers, suspended SiC micro inductors, and microheaters for on-chip chemical analysis, may be demonstrated. The fabrication process steps may largely follow steps 800-840 in FIG. 8.

To create an ultra-thin diaphragm with $BCl_3+Cl_2+Ar$ etching, the goal of the process is illustrated with respect to component 900 in the steps of FIG. 9. Component 900 includes a 3 μm 4H—SiC n-type epilayer 910 and a 150 μm 4H—SiC SI substrate 920. The process begins with a fast etch rate (ER) recipe through most of SI substrate 920, then switches to DSRIE to finish the diaphragms. In the process of FIG. 9, 15 sccm $BCl_3$, 5 sccm $Cl_2$, 20 sccm Ar, and 100 W of power are used.

Figure 10A:
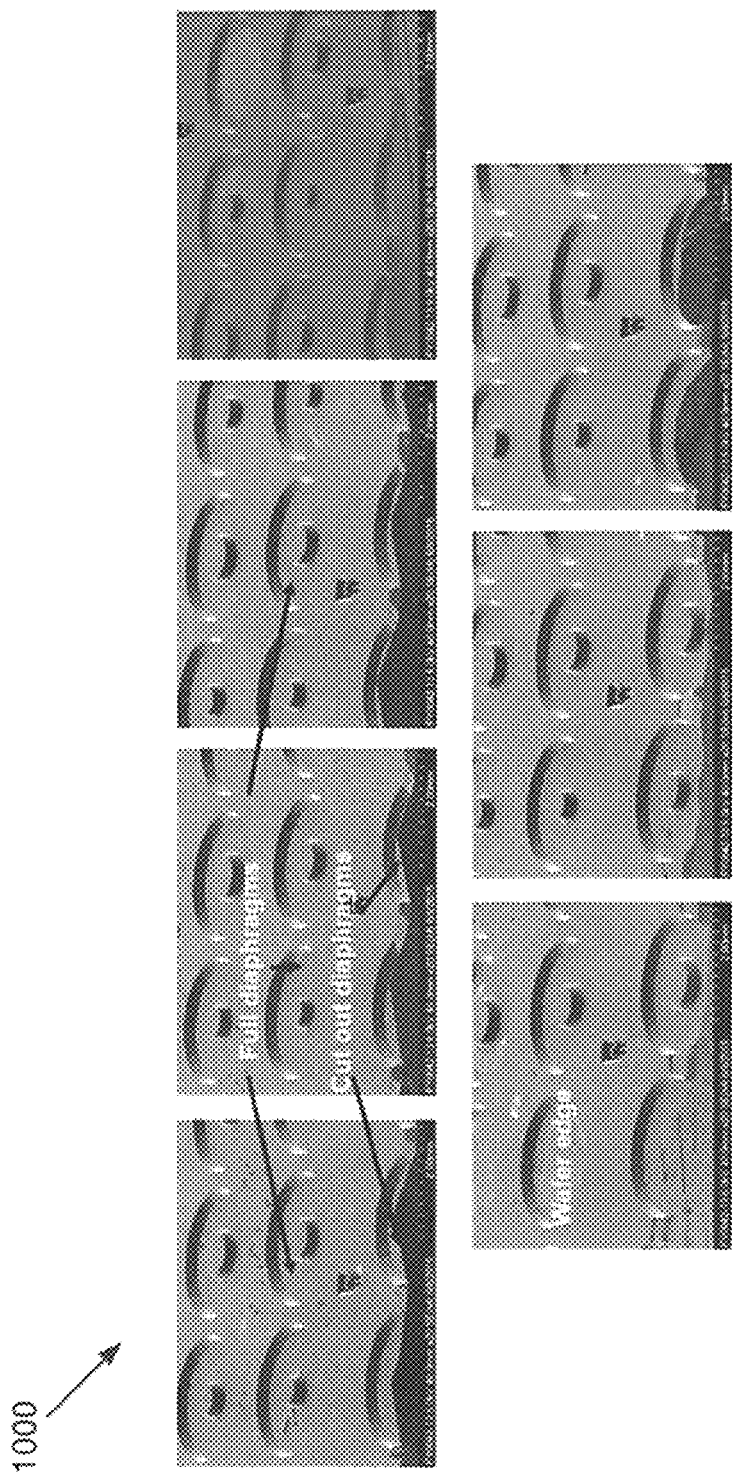
FIG. 10A illustrates magnified images that show full diaphragms, cut out diaphragms, and the wafer edge, according to an embodiment of the present invention.
Figure 10B:
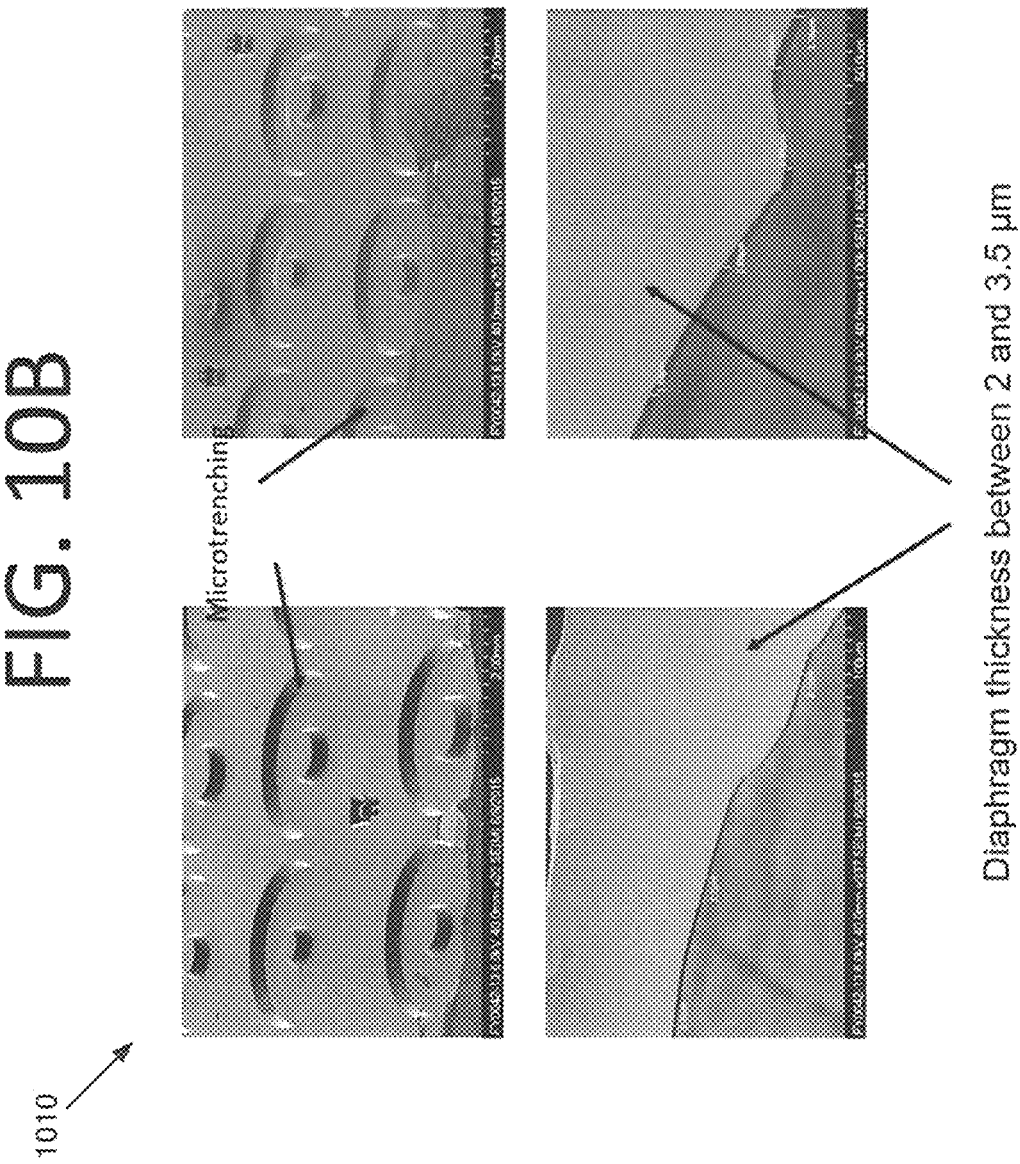

The results of this process can be seen in magnified images 1000, 1010, 1020 of FIGS. 10A-C. FIG. 10A shows full diaphragms, cut out diaphragms, and the wafer edge. FIGS. 10B and 10C show microtrenching and diaphragm thicknesses. Microtrenching is perhaps best seen in the location denoted by the circle in FIG. 10C. The observed microtrenching and etch non-uniformity across the wafer causes reduced yield. Etch condition improvements and chamber optimization may increase yield.

FIG. 11 illustrates a process 1100 for producing ultra-thin SiC diaphragms, according to an embodiment of the present invention. The process begins with a starting wafer at 1100. The starting wafer includes a 2 μm highly doped n-type 4H—SiC epitaxial layer and a 300 μm SI 4H—SiC substrate. Next, piezoresistor fabrication is performed at 1110, which defines, patterns, and dry etches the piezoresistors.

A CVD process is used to grow a high resistivity polycrystalline CVD SiC at 1120. The resistivity may be, for example, at least $1 \times 10^5$ ohms-cm in some embodiments. However, any suitable resistivity may be used without deviating from the scope of the invention. This layer may be slightly thicker than 2 μm, but may be any suitable thickness without deviating from the scope of the invention. A nickel mask is electroplated onto the bottom of the SI 4H—SiC substrate at 1130, but leaves an uncovered portion in the middle.

Diaphragm formation begins with fast RIE at 1140, which etches away a majority of the uncovered SI 4H—SiC substrate. The nickel is stripped, and the process switches to DSRIE at 1150 to complete formation of the diaphragm. Piezoresistor oxide passivation and contacts are formed via etching at 1160. The layer at the bottom in step 1160 forms as a result of the passivation. Contact metallization is performed on the piezoresistor side and this is patterned and etched at 1170. As can be seen, the bottom layer from step 1160 disappears in step 1170 due to the etching to form the contact vias.

Figure 12:
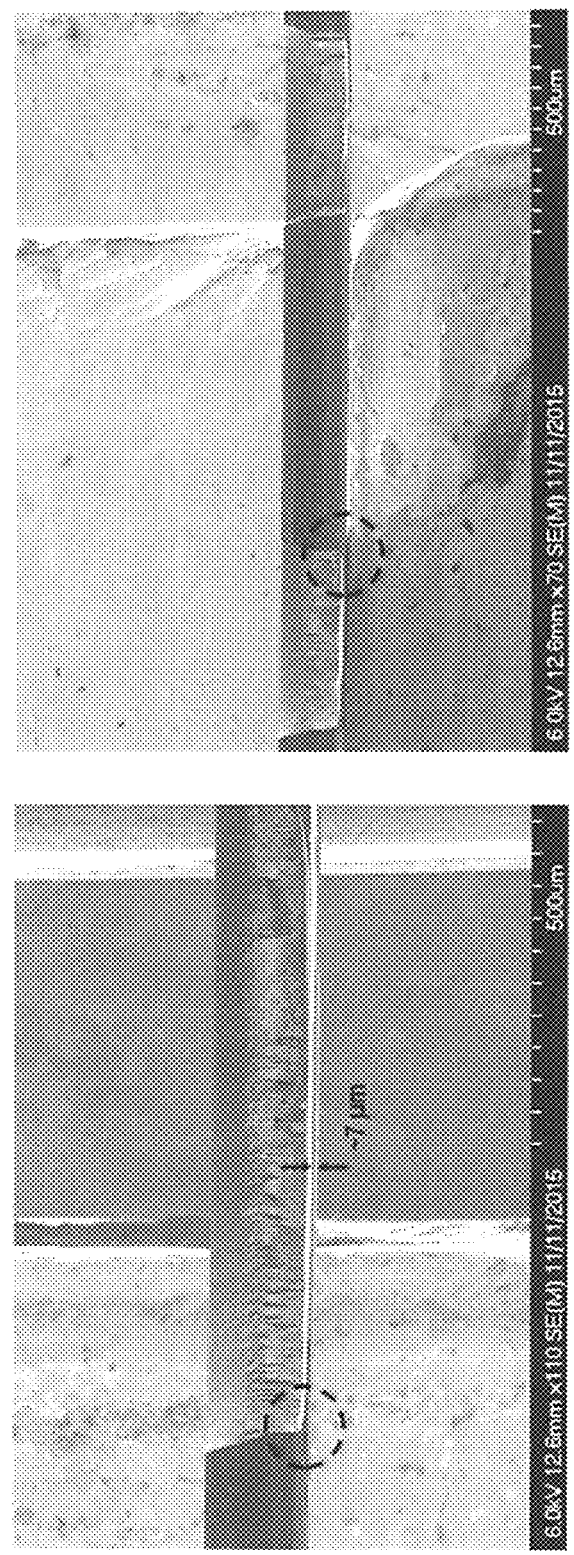
FIG. 12 illustrates magnified images showing diaphragms with microtrenches eliminated, according to an embodiment of the present invention.

FIG. 12 illustrates magnified images 1200 showing diaphragms with microtrenches eliminated, according to an embodiment of the present invention. As can be seen in the locations denoted by circles in FIG. 12, microtrenches are gone, although the diaphragm thickness grew to between 4-7 μm. This can be compared with the microtrenching seen in FIG. 10C.

Figure 13:
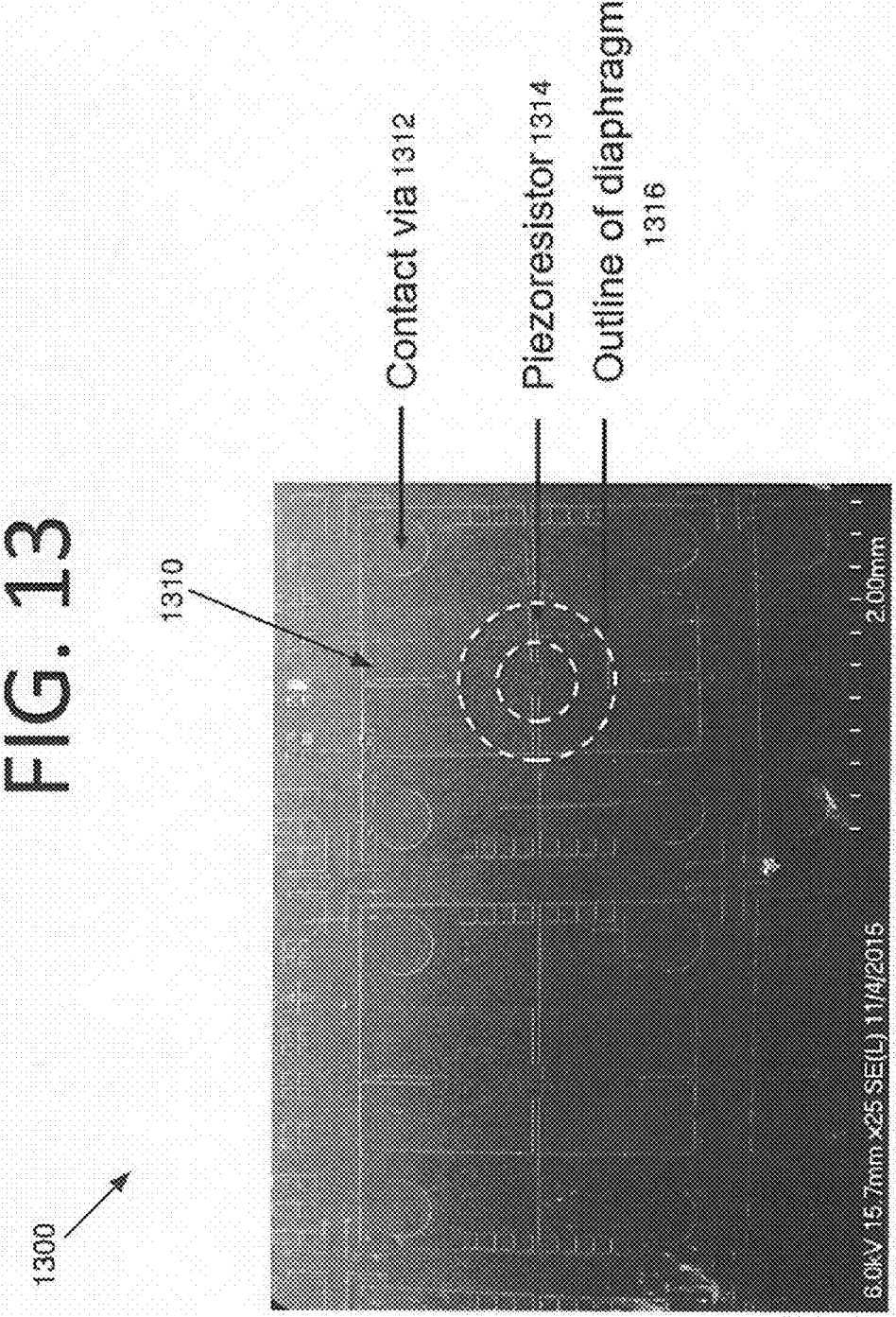
FIG. 13 is a magnified image illustrating a top of a wafer with pressure sensors, according to an embodiment of the present invention.

FIG. 13 is a magnified image illustrating a top of a wafer 1300 with pressure sensors 1310, according to an embodiment of the present invention. Each pressure sensor 1310 includes four vias 1312 and piezoresistors 1314. The outline of a diaphragm 1316 is also shown, which is not visible from the top of wafer 1300.

Figure 14:
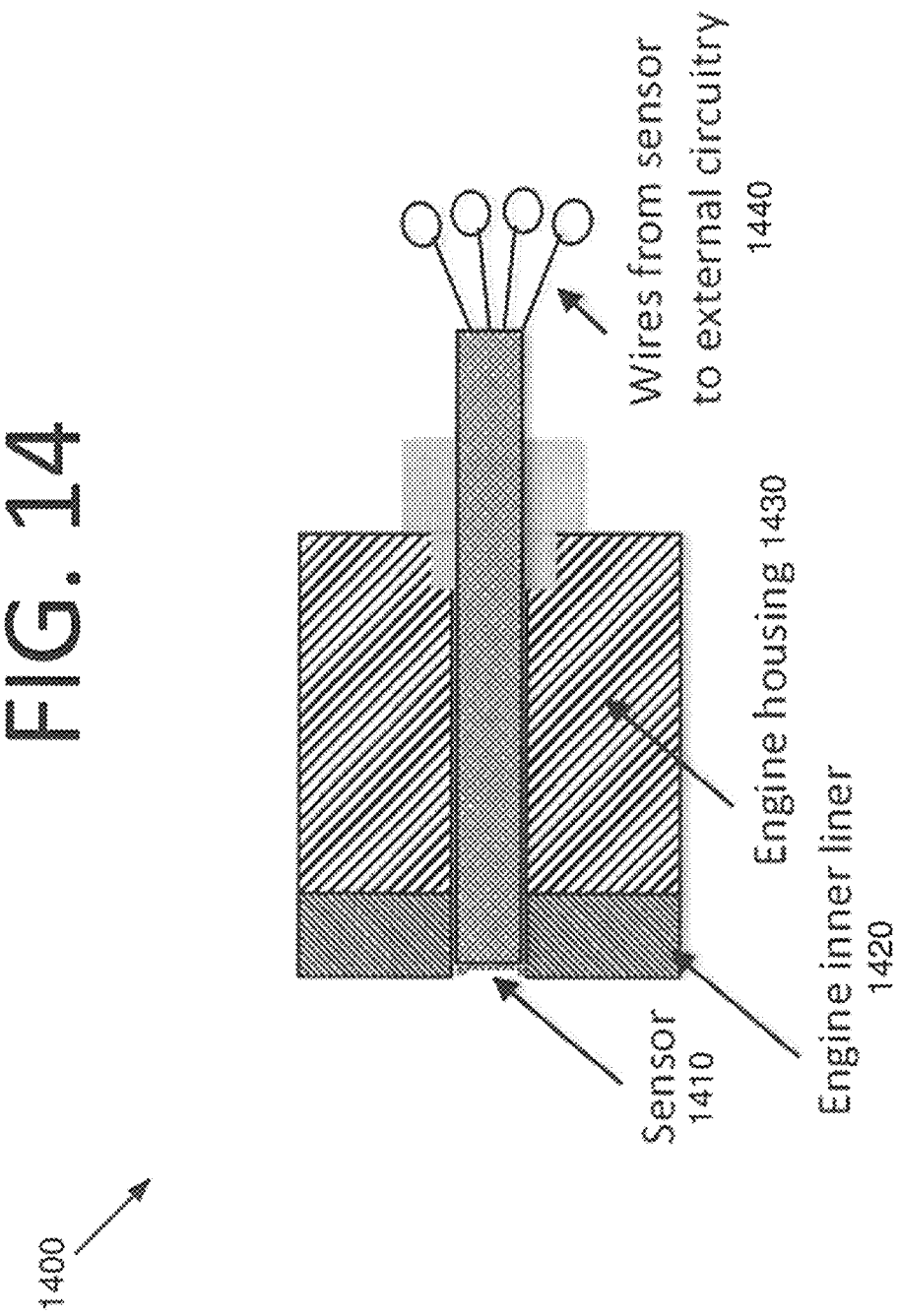
FIG. 14 illustrates a flush mounted SiC dynamic sensor, according to an embodiment of the present invention.

FIG. 14 illustrates a flush mounted SiC dynamic sensor 1400, according to an embodiment of the present invention. Flush mounted SiC dynamic sensor 1400 includes a sensor 1410, an engine inner liner 1420, and an engine housing 1430. Wires 1440 from sensor 1410 to external circuitry (not shown) are also provided.

It will be readily understood that the components of various embodiments of the present invention, as generally described and illustrated in the figures herein, may be arranged and designed in a wide variety of different configurations. Thus, the detailed description of the embodiments, as represented in the attached figures, is not intended to limit the scope of the invention as claimed, but is merely representative of selected embodiments of the invention.

The features, structures, or characteristics of the invention described throughout this specification may be combined in any suitable manner in one or more embodiments. For example, reference throughout this specification to "certain embodiments," "some embodiments," or similar language means that a particular feature, structure, or characteristic described in connection with the embodiment is included in at least one embodiment of the present invention. Thus, appearances of the phrases "in certain embodiments," "in some embodiment," "in other embodiments," or similar language throughout this specification do not necessarily all refer to the same group of embodiments and the described features, structures, or characteristics may be combined in any suitable manner in one or more embodiments.

It should be noted that reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention can be practiced without one or more of the specific features or advantages of a particular embodiment. In other instances, additional features and advantages may be recognized in certain embodiments that may not be present in all embodiments of the invention.

One having ordinary skill in the art will readily understand that the invention as discussed above may be practiced with steps in a different order, and/or with hardware elements in configurations which are different than those which are disclosed. Therefore, although the invention has been described based upon these preferred embodiments, it would be apparent to those of skill in the art that certain modifications, variations, and alternative constructions would be apparent, while remaining within the spirit and scope of the invention. In order to determine the metes and bounds of the invention, therefore, reference should be made to the appended claims.

The invention claimed is:

1. A process of making ultra-thin silicon carbide (SiC) diaphragms, comprising:
providing a wafer comprising a highly doped n-type 4H—SiC epitaxial layer and a semi-insulating (SI) 4H—SiC substrate layer;
fabricating piezoresistors on the epitaxial layer;
performing a Chemical Vapor Deposition (CVD) process to grow a high resistivity polycrystalline CVD SiC on the piezoresistors;
electroplating a nickel mask onto a bottom of the SI 4H—SiC layer, but leaving exposed sections that are not covered with nickel; and
forming diaphragms by performing Reactive Ion Etching (RIE) on the exposed sections of the SI 4H—SiC substrate, followed by performing Dopant Selective Reactive Ion Etching (DSRIE) at a lower etch rate than the RIE.

2. The process of claim 1, wherein the diaphragms produced by the process have a thickness of between 2 and 7 microns.

3. The process of claim 1, wherein the DSRIE is performed using one of sulfur hexafluoride ($SF_6$), hydrogen bromide (HBr), HBr+Ar, $BCl_3$, or $BCl_3+Cl_2$+Ar.

4. The process of claim 1, wherein the DSRIE is performed using $BCl_3+Cl_2$+Ar with flow rates of 15 sccm for $BCl_3$, 5 sccm for $Cl_2$, and 20 sccm for Ar.

5. The process of claim 1, further comprising:
forming a pressure sensor comprising the diaphragm, wherein the pressure sensor has a sensitivity in a sub-psi range.

6. The process of claim 1, wherein the diaphragms produced by the process have a thickness of between 4 and 7 microns and lack microtrenching.

7. A process of forming ultra-thin silicon carbide (SiC) diaphragms, comprising:
performing Reactive Ion Etching (RIE) on exposed sections of a non-dopant semi-insulating (SI) substrate of a wafer at a higher etch rate than achieved by means of Dopant Selective Reactive Ion Etching (DSRIE) due to dopant reactive gases that can be used during the process; and
performing DSRIE to preferentially etch a pre-determined remainder of the SI substrate, producing one or more diaphragms, wherein
the one or more diaphragms produced by the process have a thickness of between 4 and 7 microns and lack microtrenching.

8. The process of claim 7, wherein the DSRIE is performed using one of sulfur hexafluoride ($SF_6$), hydrogen bromide (HBr), HBr+Ar, $BCl_3$, or $BCl_3+Cl_2$+Ar.

9. The process of claim 7, wherein the DSRIE is performed using $BCl_3+Cl_2$+Ar with flow rates of 15 sccm for $BCl_3$, 5 sccm for $Cl_2$, and 20 sccm for Ar.

10. A process comprising:
providing a Silicon Carbide (SiC), semi-insulated wafer;
growing an n-type epitaxial layer between 2-5 microns thick on a first side of the wafer;
cleaning the wafer sequentially with acetone and isopropyl alcohol;
sequentially depositing a layer of Titanium (Ti) and Nickel (Ni) on the second side of the wafer;
applying photoresist to a portion of the Nickel (Ni);
placing a glass diaphragm mask on top of a portion of the photoresist;
exposing the mask to ultra-violet (UV) light;
removing the mask;
developing the photoresist under the ultra-violet (UV) light to expose the Nickel (Ni);

electroplating the Nickel (Ni);

bombarding the second surface of the wafer with Argon (Ar) and Sulfur Hexafluoride ($SF_6$) until reaching the n-type layer;

immersing the etched wafer in Hydrochloric Acid (HCl) and Nitric Acid ($HNO_3$) to dissolve the Nickel (Ni); so as to yield a diaphragm.

11. The process of claim 10, wherein the DSRIE is performed using one of sulfur hexafluoride ($SF_6$), hydrogen bromide (HBr), HBr+Ar, $BCl_3$, or $BCl_3$+$Cl_2$+Ar.

12. The process of claim 10, further comprising:

removing a nickel etch mask from the SI substrate by applying nickel etchant.

13. The process of claim 10, wherein the SI substrate of the wafer comprises a SI, off-axis, single crystal 4H—SiC layer.

14. The process of claim 13, wherein the wafer further comprises an n-type 4H—SiC epitaxial layer of between 2 and 4 microns on a silicon face of the wafer.

15. The process of claim 14, further comprising:

etching an array of Wheatstone bridge piezoresistive patterns into the epitaxial layer deep enough to have etched into the underlying SI substrate, forming an etched n-type piezoresistor array.

16. The process of claim 15, further comprising:

blanket depositing polycrystalline silicon carbide (SiC) over the etched n-type piezoresistor array such that the piezoresistors are completely enveloped and sandwiched between the polycrystalline SiC and the single crystal SI 4H—SiC layer.

17. The process of claim 16, further comprising:

blanket depositing a silicon dioxide layer over a diaphragm side of the wafer to provide compliant mechanical stability to the one or more diaphragms.

18. The process of claim 10, further comprising:

forming a pressure sensor comprising at least one of the one or more diaphragms, wherein the pressure sensor has a sensitivity in a sub-psi range.

19. The process of claim 10, wherein the one or more diaphragms produced by the process have a thickness of between 4 and 7 microns and lack microtrenching.

20. The process of claim 10, wherein the DSRIE is performed using $BCl_3$+$Cl_2$+Ar with flow rates of 15 sccm for $BCl_3$, 5 sccm for $Cl_2$, and 20 sccm for Ar.

* * * * *